US009552986B2

(12) United States Patent
Li et al.

(10) Patent No.: US 9,552,986 B2
(45) Date of Patent: Jan. 24, 2017

(54) FORMING A MEMORY DEVICE USING SPUTTERING TO DEPOSIT SILVER-SELENIDE FILM

(71) Applicant: MICRON TECHNOLOGY, INC., Boise, ID (US)

(72) Inventors: Jiutao Li, Boise, ID (US); Keith Hampton, Boise, ID (US); Allen McTeer, Eagle, ID (US)

(73) Assignee: MICRON TECHNOLOGY, INC., Boise, ID (US)

( * ) Notice: Subject to any disclaimer, the term of this patent is extended or adjusted under 35 U.S.C. 154(b) by 163 days.

(21) Appl. No.: 14/253,649

(22) Filed: Apr. 15, 2014

(65) Prior Publication Data

US 2014/0224646 A1    Aug. 14, 2014

Related U.S. Application Data

(63) Continuation of application No. 12/073,057, filed on Feb. 28, 2008, now abandoned, which is a continuation
(Continued)

(51) Int. Cl.
*H01L 21/02* (2006.01)
*C23C 14/06* (2006.01)
(Continued)

(52) U.S. Cl.
CPC ..... *H01L 21/02631* (2013.01); *C23C 14/0021* (2013.01); *C23C 14/0623* (2013.01);
(Continued)

(58) Field of Classification Search
CPC .......... C23C 14/0623; H01L 21/02266; H01L 21/02631
See application file for complete search history.

(56) References Cited

U.S. PATENT DOCUMENTS 3,095,330 A    6/1963 Epstein et al.
3,271,591 A    9/1966 Ovshinsky
(Continued)

FOREIGN PATENT DOCUMENTS

JP    56126916    10/1981
JP    60-184885    9/1985
(Continued)

OTHER PUBLICATIONS

Abdel-All, A.; Elshafie,A.; Elhawary, M.M., DC Electric-field Effect in Bulk and Thin-film Ge5As38Te57 Chalcogenide Glass, Vacuum 59 (2000) 845-853.
(Continued)

*Primary Examiner* — Michael Jung
(74) *Attorney, Agent, or Firm* — Holland & Hart LLP

(57) ABSTRACT

A method of sputter depositing silver selenide and controlling the stoichiometry and nodular defect formations of a sputter deposited silver-selenide film. The method includes depositing silver-selenide using a sputter deposition process at a pressure of about 0.3 mTorr to about 10 mTorr. In accordance with one aspect of the invention, an RF sputter deposition process may be used preferably at pressures of about 2 mTorr to about 3 mTorr. In accordance with another aspect of the invention, a pulse DC sputter deposition process may be used preferably at pressures of about 4 mTorr to about 5 mTorr.

9 Claims, 1 Drawing Sheet

Pulse DC Ag$_2$Se sputter deposition at different pressure. (a) 20mTorr deposition, (b)10mTorr deposition, (c) 3mTorr deposition.

Related U.S. Application Data of application No. 10/230,279, filed on Aug. 29, 2002, now Pat. No. 7,364,644.

(51) Int. Cl.
*C23C 14/00* (2006.01)
*C23C 14/34* (2006.01)
*C23C 14/54* (2006.01)

(52) U.S. Cl.
CPC ...... *C23C 14/3407* (2013.01); *C23C 14/3492* (2013.01); *C23C 14/548* (2013.01); *H01L 21/02266* (2013.01); *Y10S 428/938* (2013.01); *Y10T 428/12896* (2015.01)

(56) References Cited

U.S. PATENT DOCUMENTS

| | | | |
|---|---|---|---|
| 3,450,967 A | 6/1969 | Tolutis Vitautas Balio | |
| 3,622,319 A | 11/1971 | Sharp | |
| 3,743,847 A | 7/1973 | Boland | |
| 3,961,314 A | 6/1976 | Klose et al. | |
| 3,966,317 A | 6/1976 | Wacks et al. | |
| 3,983,542 A | 9/1976 | Ovshinsky | |
| 3,988,720 A | 10/1976 | Ovshinsky | |
| 4,177,474 A | 12/1979 | Ovshinsky | |
| 4,267,261 A | 5/1981 | Hallman et al. | |
| 4,269,935 A | 5/1981 | Masters et al. | |
| 4,312,938 A | 1/1982 | Drexler et al. | |
| 4,316,946 A | 2/1982 | Masters et al. | |
| 4,320,191 A | 3/1982 | Yoshikawa et al. | |
| 4,405,710 A | 9/1983 | Balasubramanyam et al. | |
| 4,419,421 A | 12/1983 | Wichelhaus et al. | |
| 4,499,557 A | 2/1985 | Holmberg et al. | |
| 4,597,162 A | 7/1986 | Johnson et al. | |
| 4,608,296 A | 8/1986 | Keem et al. | |
| 4,637,895 A | 1/1987 | Ovshinsky et al. | |
| 4,646,266 A | 2/1987 | Ovshinsky et al. | |
| 4,664,939 A | 5/1987 | Ovshinsky | |
| 4,668,968 A | 5/1987 | Ovshinsky et al. | |
| 4,670,763 A | 6/1987 | Ovshinsky et al. | |
| 4,671,618 A | 6/1987 | Wu et al. | |
| 4,673,957 A | 6/1987 | Ovshinsky et al. | |
| 4,678,679 A | 7/1987 | Ovshinsky | |
| 4,696,758 A | 9/1987 | Ovshinsky et al. | |
| 4,698,234 A | 10/1987 | Ovshinsky et al. | |
| 4,710,899 A | 12/1987 | Young et al. | |
| 4,728,406 A | 3/1988 | Banerjee et al. | |
| 4,737,379 A | 4/1988 | Hudgens et al. | |
| 4,766,471 A | 8/1988 | Ovshinsky et al. | |
| 4,767,695 A | 8/1988 | Ong et al. | |
| 4,769,338 A | 9/1988 | Ovshinsky et al. | |
| 4,775,425 A | 10/1988 | Guha et al. | |
| 4,788,594 A | 11/1988 | Ovshinsky et al. | |
| 4,795,657 A | 1/1989 | Formigoni et al. | |
| 4,800,526 A | 1/1989 | Lewis | |
| 4,809,044 A | 2/1989 | Pryor et al. | |
| 4,818,717 A | 4/1989 | Johnson et al. | |
| 4,839,208 A | 6/1989 | Nakagawa et al. | |
| 4,843,443 A | 6/1989 | Ovshinsky et al. | |
| 4,845,533 A | 7/1989 | Pryor et al. | |
| 4,847,674 A | 7/1989 | Sliwa et al. | |
| 4,853,785 A | 8/1989 | Ovshinsky et al. | |
| 4,891,330 A | 1/1990 | Guha et al. | |
| 5,102,708 A | 4/1992 | Matsubara et al. | |
| 5,128,099 A | 7/1992 | Strand et al. | |
| 5,159,661 A | 10/1992 | Ovshinsky et al. | |
| 5,166,758 A | 11/1992 | Ovshinsky et al. | |
| 5,177,567 A | 1/1993 | Klersy et al. | |
| 5,219,788 A | 6/1993 | Abernathey et al. | |
| 5,238,862 A | 8/1993 | Blalock et al. | |
| 5,272,359 A | 12/1993 | Nagasubramanian et al. | |
| 5,296,716 A | 3/1994 | Ovshinsky et al. | |
| 5,297,132 A | 3/1994 | Takano et al. | |
| 5,314,772 A | 5/1994 | Kozicki | |
| 5,315,131 A | 5/1994 | Kishimoto et al. | |
| 5,335,219 A | 8/1994 | Ovshinsky et al. | |
| 5,341,328 A | 8/1994 | Ovshinsky et al. | |
| 5,350,484 A | 9/1994 | Gardner et al. | |
| 5,359,205 A | 10/1994 | Ovshinsky | |
| 5,360,981 A | 11/1994 | Owen et al. | |
| 5,406,509 A | 4/1995 | Ovshinsky et al. | |
| 5,414,271 A | 5/1995 | Ovshinsky et al. | |
| 5,498,558 A | 3/1996 | Kapoor | |
| 5,500,532 A | 3/1996 | Kozicki et al. | |
| 5,512,328 A | 4/1996 | Yoshimura et al. | |
| 5,512,773 A | 4/1996 | Wolf et al. | |
| 5,534,711 A | 7/1996 | Ovshinsky et al. | |
| 5,534,712 A | 7/1996 | Ovshinsky et al. | |
| 5,536,947 A | 7/1996 | Klersy et al. | |
| 5,543,737 A | 8/1996 | Ovshinsky | |
| 5,555,537 A | 9/1996 | Imaino et al. | |
| 5,591,501 A | 1/1997 | Ovshinsky et al. | |
| 5,596,522 A | 1/1997 | Ovshinsky et al. | |
| 5,650,648 A * | 7/1997 | Kapoor | H01L 21/28518 257/316 |
| 5,687,112 A | 11/1997 | Ovshinsky | |
| 5,694,054 A | 12/1997 | Ovshinsky et al. | |
| 5,714,768 A | 2/1998 | Ovshinsky et al. | |
| 5,726,083 A | 3/1998 | Takaishi | |
| 5,751,012 A | 5/1998 | Wolstenholme et al. | |
| 5,761,115 A | 6/1998 | Kozicki et al. | |
| 5,789,277 A | 8/1998 | Zahorik et al. | |
| 5,810,982 A | 9/1998 | Sellers et al. | |
| 5,814,527 A | 9/1998 | Wolstenholme et al. | |
| 5,818,749 A | 10/1998 | Harshfield | |
| 5,825,046 A | 10/1998 | Czubatyj et al. | |
| 5,841,150 A | 11/1998 | Gonzalez et al. | |
| 5,846,889 A | 12/1998 | Harbison et al. | |
| 5,851,882 A | 12/1998 | Harshfield | |
| 5,869,843 A | 2/1999 | Harshfield | |
| 5,896,312 A | 4/1999 | Kozicki et al. | |
| 5,912,839 A | 6/1999 | Ovshinsky et al. | |
| 5,914,893 A | 6/1999 | Kozicki et al. | |
| 5,920,788 A | 7/1999 | Reinberg | |
| 5,933,365 A | 8/1999 | Klersy et al. | |
| 5,998,066 A | 12/1999 | Block et al. | |
| 6,011,757 A | 1/2000 | Ovshinsky | |
| 6,031,287 A | 2/2000 | Harshfield | |
| 6,072,716 A | 6/2000 | Jacobson et al. | |
| 6,077,729 A | 6/2000 | Harshfield | |
| 6,084,796 A | 7/2000 | Kozicki et al. | |
| 6,087,674 A | 7/2000 | Ovshinsky et al. | |
| 6,117,720 A | 9/2000 | Harshfield | |
| 6,127,016 A | 10/2000 | Yamada et al. | |
| 6,141,241 A | 10/2000 | Ovshinsky et al. | |
| 6,143,604 A | 11/2000 | Chiang et al. | |
| 6,177,338 B1 | 1/2001 | Liaw et al. | |
| 6,236,059 B1 | 5/2001 | Wolsteinholme et al. | |
| RE37,259 E | 7/2001 | Ovshinsky | |
| 6,268,662 B1 * | 7/2001 | Test | H01L 21/563 257/773 |
| 6,297,170 B1 | 10/2001 | Gabriel et al. | |
| 6,300,684 B1 | 10/2001 | Gonzalez et al. | |
| 6,316,784 B1 | 11/2001 | Zahorik et al. | |
| 6,329,606 B1 | 12/2001 | Freyman et al. | |
| 6,339,544 B1 | 1/2002 | Chiang et al. | |
| 6,348,365 B1 | 2/2002 | Moore et al. | |
| 6,350,679 B1 | 2/2002 | McDaniel et al. | |
| 6,376,284 B1 | 4/2002 | Gonzalez et al. | |
| 6,388,324 B2 | 5/2002 | Kozicki et al. | |
| 6,391,688 B1 | 5/2002 | Gonzalez et al. | |
| 6,404,665 B1 | 6/2002 | Lowery et al. | |
| 6,414,376 B1 | 7/2002 | Thakur et al. | |
| 6,418,049 B1 | 7/2002 | Kozicki et al. | |
| 6,420,725 B1 | 7/2002 | Harshfield | |
| 6,423,628 B1 | 7/2002 | Li et al. | |
| 6,429,064 B1 | 8/2002 | Wicker | |
| 6,437,383 B1 | 8/2002 | Xu | |
| 6,440,837 B1 | 8/2002 | Harshfield | |
| 6,462,984 B1 | 10/2002 | Xu et al. | |
| 6,469,364 B1 | 10/2002 | Kozicki | |
| 6,473,332 B1 | 10/2002 | Ignatiev et al. | |
| 6,480,438 B1 | 11/2002 | Park | |
| 6,487,106 B1 | 11/2002 | Kozicki | |

(56) References Cited

U.S. PATENT DOCUMENTS

| | | | |
|---|---|---|---|
| 6,487,113 B1 | 11/2002 | Park et al. | |
| 6,501,111 B1 | 12/2002 | Lowery | |
| 6,507,061 B1 | 1/2003 | Hudgens et al. | |
| 6,511,862 B2 | 1/2003 | Hudgens et al. | |
| 6,511,867 B2 | 1/2003 | Lowery et al. | |
| 6,512,241 B1 | 1/2003 | Lai | |
| 6,514,805 B2 | 2/2003 | Xu et al. | |
| 6,531,373 B2 | 3/2003 | Gill et al. | |
| 6,534,781 B2 | 3/2003 | Dennison | |
| 6,545,287 B2 | 4/2003 | Chiang | |
| 6,545,907 B1 | 4/2003 | Lowery et al. | |
| 6,555,860 B2 | 4/2003 | Lowery et al. | |
| 6,563,164 B2 | 5/2003 | Lowery et al. | |
| 6,566,700 B2 | 5/2003 | Xu | |
| 6,567,293 B1 | 5/2003 | Lowery et al. | |
| 6,569,705 B2 | 5/2003 | Chiang et al. | |
| 6,570,784 B2 | 5/2003 | Lowery | |
| 6,576,543 B2 * | 6/2003 | Lin | H01L 21/28562 257/E21.171 |
| 6,576,921 B2 | 6/2003 | Lowery | |
| 6,586,761 B2 | 7/2003 | Lowery | |
| 6,589,714 B2 | 7/2003 | Maimon et al. | |
| 6,590,807 B2 | 7/2003 | Lowery | |
| 6,593,176 B2 | 7/2003 | Dennison | |
| 6,597,009 B2 | 7/2003 | Wicker | |
| 6,605,527 B2 | 8/2003 | Dennison et al. | |
| 6,607,869 B1 | 8/2003 | Kojima et al. | |
| 6,613,604 B2 | 9/2003 | Maimon et al. | |
| 6,621,095 B2 | 9/2003 | Chiang et al. | |
| 6,625,054 B2 | 9/2003 | Lowery et al. | |
| 6,642,102 B2 | 11/2003 | Xu | |
| 6,646,297 B2 | 11/2003 | Dennison | |
| 6,649,928 B2 | 11/2003 | Dennison | |
| 6,667,900 B2 | 12/2003 | Lowery et al. | |
| 6,671,710 B2 | 12/2003 | Ovshinsky et al. | |
| 6,673,648 B2 | 1/2004 | Lowrey | |
| 6,673,700 B2 | 1/2004 | Dennison et al. | |
| 6,674,115 B2 | 1/2004 | Hudgens et al. | |
| 6,687,153 B2 | 2/2004 | Lowery | |
| 6,687,427 B2 | 2/2004 | Ramalingam et al. | |
| 6,690,026 B2 | 2/2004 | Peterson | |
| 6,696,355 B2 | 2/2004 | Dennison | |
| 6,707,712 B2 | 3/2004 | Lowery | |
| 6,714,954 B2 | 3/2004 | Ovshinsky et al. | |
| 6,734,455 B2 | 5/2004 | Li | |
| 6,849,868 B2 * | 2/2005 | Campbell | H01L 45/085 257/2 |
| 6,890,790 B2 * | 5/2005 | Li | H01L 45/085 257/E45.002 |
| 7,151,273 B2 | 12/2006 | Campbell et al. | |
| 2002/0000666 A1 | 1/2002 | Kozicki et al. | |
| 2002/0015292 A1 * | 2/2002 | Pritchett | H01L 25/18 361/780 |
| 2002/0072188 A1 | 6/2002 | Gilton | |
| 2002/0106849 A1 | 8/2002 | Moore | |
| 2002/0123169 A1 | 9/2002 | Moore et al. | |
| 2002/0123170 A1 | 9/2002 | Moore et al. | |
| 2002/0123248 A1 | 9/2002 | Moore et al. | |
| 2002/0127886 A1 | 9/2002 | Moore et al. | |
| 2002/0132417 A1 | 9/2002 | Li | |
| 2002/0160551 A1 | 10/2002 | Harshfield | |
| 2002/0163828 A1 | 11/2002 | Krieger et al. | |
| 2002/0168820 A1 | 11/2002 | Kozicki | |
| 2002/0168852 A1 | 11/2002 | Harshfield et al. | |
| 2002/0190289 A1 | 12/2002 | Harshfield et al. | |
| 2002/0190350 A1 | 12/2002 | Kozicki et al. | |
| 2003/0001229 A1 | 1/2003 | Moore et al. | |
| 2003/0027416 A1 | 2/2003 | Moore | |
| 2003/0032254 A1 | 2/2003 | Gilton | |
| 2003/0035314 A1 | 2/2003 | Kozicki | |
| 2003/0035315 A1 | 2/2003 | Kozicki | |
| 2003/0038301 A1 | 2/2003 | Moore | |
| 2003/0043631 A1 | 3/2003 | Gilton et al. | |
| 2003/0045049 A1 | 3/2003 | Campbell et al. | |
| 2003/0045054 A1 | 3/2003 | Campbell et al. | |
| 2003/0047765 A1 | 3/2003 | Campbell | |
| 2003/0047772 A1 | 3/2003 | Li | |
| 2003/0047773 A1 | 3/2003 | Li | |
| 2003/0048519 A1 | 3/2003 | Kozicki | |
| 2003/0048744 A1 | 3/2003 | Ovshinsky et al. | |
| 2003/0049912 A1 | 3/2003 | Campbell et al. | |
| 2003/0068861 A1 | 4/2003 | Li et al. | |
| 2003/0068862 A1 | 4/2003 | Li et al. | |
| 2003/0095426 A1 | 5/2003 | Hush et al. | |
| 2003/0096497 A1 | 5/2003 | Moore et al. | |
| 2003/0107105 A1 | 6/2003 | Kozicki | |
| 2003/0117831 A1 | 6/2003 | Hush | |
| 2003/0128612 A1 | 7/2003 | Moore et al. | |
| 2003/0137869 A1 | 7/2003 | Kozicki | |
| 2003/0143782 A1 | 7/2003 | Gilton et al. | |
| 2003/0155589 A1 | 8/2003 | Campbell et al. | |
| 2003/0155606 A1 | 8/2003 | Campbell et al. | |
| 2003/0156447 A1 | 8/2003 | Kozicki | |
| 2003/0156463 A1 | 8/2003 | Casper et al. | |
| 2003/0183507 A1 | 10/2003 | Li et al. | |
| 2003/0209728 A1 | 11/2003 | Kozicki et al. | |
| 2003/0209971 A1 | 11/2003 | Kozicki et al. | |
| 2003/0210564 A1 | 11/2003 | Kozicki et al. | |
| 2003/0212724 A1 | 11/2003 | Ovshinsky et al. | |
| 2003/0212725 A1 | 11/2003 | Ovshinsky et al. | |
| 2004/0007749 A1 * | 1/2004 | Campbell | H01L 29/267 257/411 |
| 2004/0014314 A1 * | 1/2004 | Brooks | H01L 21/2855 438/679 |
| 2004/0035401 A1 | 2/2004 | Ramachandran et al. | |
| 2005/0103621 A1 | 5/2005 | Li et al. | |

FOREIGN PATENT DOCUMENTS

| | | |
|---|---|---|
| JP | 01-241035 | 9/1989 |
| WO | WO 86/02744 A | 5/1986 |
| WO | WO 97/48032 | 12/1997 |
| WO | WO 99/28914 | 6/1999 |
| WO | WO 00/48196 | 8/2000 |
| WO | WO 02/21542 | 3/2002 |
| WO | WO 03/071614 A | 8/2003 |

OTHER PUBLICATIONS

Adler, D.; Moss, S.C., Amorphous Memories and Bistable Switches, J. Vac. Sci. Technol. 9 (1972) 1182-1189.

Adler, D.; Henisch, H.K.; Mott, S.N., The Mechanism of Threshold Switching in Amorphous Alloys, Rev. Mod. Phys. 50 (1978) 209-220.

Afifi, M.A.; Labib, H.H.; El-Fazary, M.H.; Fadel, M., Electrical and Thermal Properties of Chalcogenide Glass System Se75Ge25-xSbx, Appl. Phys. A 55 (1992) 167-169.

Afifi,M.A.; Labib, H.H.; Fouad, S.S.; El-Shazly, A.A., Electrical & Thermal Conductivity of the Amorphous Semiconductor GexSe1-x, Egypt, J. Phys. 17 (1986) 335-342.

Alekperova, Sh.M.; Gadzhieva, G.S., Current-voltage Characteristics of Ag2Se Single Crystal Near the Phase Transition, Inorganic Materials 23 (1987) 137-139.

Aleksiejunas, A.; Cesnys, A., Switching Phenomenon and Memory Effect in Thin-film Heterojunction of Polycrystalline Selenium-silver Selenide, Phys. Stat. Sol. (a) 19 (1973) K169-K171.

Angell, C.A., Mobile Ions in Amorphous Solids, Annu. Rev. Phys. Chem. 43 (1992) 693-717.

Aniya, M., Average Electronegativity, Medium-range-order, and Ionic Conductivity in Superionic Glasses, Solid State Ionics 136-137 (2000) 1085-1089.

Asahara, Y.; Izumitani, T., Voltage Controlled Switching in Cu—As—Se Compositions, J. Non-Cryst. Solids 11 (1972) 97-104.

Asokan, S.; Prasad, M.V.N.; Parthasarathy, G.; Gopal, E.S.R., Mechanical and Chemical Thresholds in IV-VI Chalcogenide Glasses, Phys. Rev. Lett. 62 (1989) 808-810.

Axon Technologies Corporation, Technology Description: *Programmable Metalization Cell (PMC)*, pp. 1-6 (pre-May 2000).

Baranovskii, S.D.; Cordes, H., On the Conduction Mechanism in Ionic Glasses, J. Chem. Phys. 111 (1999) 7546-7557.

(56) References Cited

OTHER PUBLICATIONS

Belin, R.; Taillades, G.; Pradel, A.; Ribes, M., Ion Dynamics in Superionic Chalcogenide Glasses: CompleteConductivity Spectra, Solid State Ionics 136-137 (2000) 1025-1029.

Belin, R.; Zerouale, A.; Pradel, A.; Ribes, M., Ion Dynamics in the Argyrodite Compound Ag7GeSe5I: Non-Arrhenius Behavior and Complete Conductivity Spectra, Solid State Ionics 143 (2001) 445-455.

Benmore, C.J.; Salmon, P.S., Structure of Fast Ion Conducting and Semiconducting Glassy Chalcogenide Alloys, Phys. Rev. Lett. 73 (1994) 264-267.

Bernede, J.C., Influence Du Metal Des Electrodes Sur Les Caracteristiques Courant-tension Des Structures M—Ag2Se—M, Thin Solid Films 70 (1980) L1-L4.

Bernede, J.C., Polarized Memory Switching in MIS Thin Films, Thin Solid Films 81 (1981) 155-160.

Bernede, J.C., Switching and Silver Movements in Ag2Se Thin Films, Phys. Stat. Sol. (a) 57 (1980) K101-K104.

Bernede, J.C.; Abachi, T., Differential Negative Resistance in Metal/insulator/metal Structures with an Upper Bilayer Electrode, Thin Solid Films 131 (1985) L61-L64.

Bernede, J.C.; Conan, A.; Fousenan't, E.; El Bouchairi, B.; Goureaux, G., Polarized Memory Switching Effects in Ag2Se/Se/M Thin Film Sandwiches, Thin Solid Films 97 (1982) 165-171.

Bernede, J.C.; Khelil, A.; Kettaf, M.; Conan, A., Transition from S- to N-type Differential Negative Resistance in Al—Al2O3—Ag2—xSe1+x Thin Film Structures, Phys. Stat. Sol. (a) 74 (1982) 217-224.

Bondarev, V.N.; Pikhitsa, P.V., A Dendrite Model of Current Instability in RbAg4I5, Solid State Ionics 70/71 (1994) 72-76.

Boolchand, P., The Maximum in Glass Transition Temperature (Tg) Near x=1/3 in GexSe1-x Glasses, Asian Journal of Physics (2000) 9, 709-72.

Boolchand, P.; Bresser, W.J., Mobile Silver Ions and Glass Formation in Solid Electrolytes, Nature 410 (2001) 1070-1073.

Boolchand, P.; Georgiev, D.G.; Goodman, B., Discovery of the Intermediate Phase in Chalcogenide Glasses, J. Optoelectronics and Advanced Materials, 3 (2001), 703.

Boolchand, P.; Selvanathan, D.; Wang, Y.; Georgiev, D.G.; Bresser, W.J., Onset of Rigidity in Steps in Chalcogenide Glasses, Properties and Applications of Amorphous Materials, M.F. Thorpe and Tichy, L. (eds.) Kluwer Academic Publishers, the Netherlands, 2001, pp. 97-132.

Boolchand, P.; Enzweiler, R.N.; Tenhover, M., Structural Ordering of Evaporated Amorphous Chalcogenide Alloy Ffilms: Role of Thermal Annealing, Diffusion and Defect Data vol. 53-54 (1987) 415-420.

Boolchand, P.; Grothaus, J.; Bresser, W.J.; Suranyi, P., Structural Origin of Broken Chemical Order in a GeSe2 glass, Phys. Rev. B 25 (1982) 2975-2978.

Boolchand, P.; Grothaus, J.; Phillips, J.C., Broken Chemical Order and Phase Separation in GexSe1-x Glasses, Solid State Comm. 45 (1983) 183-185.

Boolchand, P., Bresser, W.J., Compositional Trends in Glass Transition Temperature (Tg), Network Connectivity and Nanoscale Chemical Phase Separation in Chalcogenides, Dept. of ECECS, Univ. Cincinnati (Oct. 28, 1999) 45221-0030.

Boolchand, P.; Grothaus, J, Molecular Structure of Melt-Quenched GeSe2 and GeS2 Glasses Compared, Proc. Int. Conf. Phys. Semicond. (Eds. Chadi and Harrison) $17^{th}$ (1985) 833-36.

Bresser, W.; Boolchand, P.; Suranyi, P., Rigidity Percolation and Molecular Clustering in Network Glasses, Phys. Rev. Lett. 56 (1986) 2493-2496.

Bresser, W.J.; Boolchand, P.; Suranyi, P.; de Neufville, J.P, Intrinsically Broken Chalcogen Chemical Order in Stoichiometric Glasses, Journal de Physique 42 (1981) C4-193-C4-196.

Bresser, W.J.; Boolchand, P.; Suranyi, P.; Hernandez, J.G., Molecular Phase Separation and Cluster Size in GeSe2 glass, Hyperfine Interactions 27 (1986) 389-392.

Cahen, D.; Gilet, J.-M.; Schmitz, C.; Chernyak, L.; Gartsman, K.; Jakubowicz, A., Room-temperature, Electric Field Induced Creation of Stable Devices in CuInSe2 Crystals, Science 258 (1992) 271-274.

Chatterjee, R.; Asokan, S.; Titus, S.S.K., Current-controlled Negative-resistance Behavior and Memory Switching in Bulk As—Te—Se Glasses, J. Phys. D: Appl. Phys. 27 (1994) 2624-2627.

Chen, C.H.; Tai, K.L. , Whisker Growth Induced by Ag Photodoping in Glassy GexSe1-x Films, Appl. Phys. Lett. 37 (1980) 1075-1077.

Chen, G.; Cheng, J., Role of Nitrogen in the Crystallization of Silicon Nitride-doped Chalcogenide Glasses, J. Am. Ceram. Soc. 82 (1999) 2934-2936.

Chen, G.; Cheng, J.; Chen, W., Effect of Si3N4 on Chemical Durability of Chalcogenide Glass, J. Non-Cryst. Solids 220 (1997) 249-253.

Cohen, M.H.; Neale, R.G.; Paskin, A., A Model for an Amorphous Semiconductor Memory Device, J. Non-Cryst. Solids 8-10 (1972) 885-891.

Croitoru, N.; Lazarescu, M.; Popescu, C.; Telnic, M.; and Vescan, L., Ohmic and Non-ohmic Conduction in Some Amorphous Semiconductors, J. Non-Cryst. Solids 8-10 (1972) 781-786.

Dalven, R.; Gill, R., Electrical Properties of Beta-Ag2Te and Beta-Ag2Se From 4.2° to 300° K, J. Appl. Phys. 38 (1967) 753-756.

Davis, E.A., Semiconductors Without Form, Search 1 (1970) 152-155.

Dearnaley, G.; Stoneham, A.M.; Morgan, D.V., Electrical Phenomena in Amorphous Oxide Films, Rep. Prog. Phys. 33 (1970) 1129-1191.

Dejus, R.J.; Susman, S.; Volin, K.J.; Montague, D.G.; Price, D.L., Structure of Vitreous Ag—Ge—Se, J. Non-Cryst. Solids 143 (1992) 162-180.

den Boer, W., Threshold Switching in Hydrogenated Amorphous Silicon, Appl. Phys. Lett. 40 (1982) 812-813.

Drusedau, T.P.; Panckow, A.N.; Klabunde, F., The Hydrogenated Amorphous Silicon/nanodisperse Metal (SIMAL) System-Films of Unique Electronic Properties, J. Non-Cryst. Solids 198-200 (1996) 829-832.

El Bouchairi, B.; Bernede, J.C.; Burgaud, P., Properties of Ag2-xSe1+x/n-Si Diodes, Thin Solid Films 110 (1983) 107-113.

El Gharras, Z.; Bourahla, A.; Vautier, C., Role of Photoinduced Defects in Amorphous GexSe1-x Photoconductivity, J. Non-Cryst. Solids 155 (1993) 171-179.

El Ghrandi, R.; Calas, J.; Galibert, G.; Averous, M., Silver Photodissolution in Amorphous Chalcogenide Tthin Films, Thin Solid Films 218 (1992) 259-273.

El Ghrandi, R.; Calas, J.; Galibert, G., Ag Dissolution Kinetics in Amorphous GeSe5.5 Thin Films from "In-situ" Resistance Measurements vs. Time, Phys. Stat. Sol. (a) 123 (1991) 451-460.

El-kady, Y.L., The Threshold Switching in Semiconducting Glass Ge21Se17Te62, Indian J. Phys. 70A (1996) 507-516.

Elliott, S.R., A Unified Mechanism for Metal Photodissolution in Amorphous Chalcogenide Materials, J. Non-Cryst. Solids 130 (1991) 85-97.

Elliott, S.R., Photodissolution of Metals in Chalcogenide Glasses: A Unified Mechanism, J. Non-Cryst. Solids 137-138 (1991) 1031-1034.

Elsamanoudy, M.M.; Hegab, N.A.; Fadel, M., Conduction Mechanism in the Pre-switching State of Thin Films Containing Te As Ge Si, Vacuum 46 (1995) 701-707.

Ei-Zahed, H.; El-Korashy, A., Influence of Composition on the Electrical and Optical Properties of Ge20BixSe80-x Films, Thin Solid Films 376 (2000) 236-240.

Fadel, M., Switching Phenomenon in Evaporated Se—Ge—As Thin Films of Amorphous Chalcogenide Glass, Vacuum 44 (1993) 851-855.

Fadel, M.; El-Shair, H.T., Electrical, Thermal and Optical Properties of Se75Ge7Sb18, Vacuum 43 (1992) 253-257.

Feng, X. Bresser, W.J.; Boolchand, P., Direct Evidence for Stiffness Threshold in Chalcogenide Glasses, Phys. Rev. Lett. 78 (1997) 4422-4425.

(56) References Cited

OTHER PUBLICATIONS

Feng, X. Bresser, W.J.; Zhang, M.; Goodman, B.; Boolchand, P., Role of Network Connectivity on the Elastic, Plastic and Thermal Behavior of Covalent Glasses, J. Non-Cryst. Solids 222 (1997) 137-143.

Fischer-Colbrie, A.; Bienenstock, A.; Fuoss, P.H.; Marcus, M.A., Structure and Bonding in Photodiffused Amorphous Ag—GeSe2 Thin Films, Phys. Rev. B 38 (1988) 12388-12403.

Fleury, G.; Hamou, A.; Viger, C.; Vautier, C., Conductivity and Crystallization of Amorphous Selenium, Phys. Stat. Sol. (a) 64 (1981) 311-316.

Fritzsche, H, Optical and Electrical Energy Gaps in Amorphous Semiconductors, J. Non-Cryst. Solids 6 (1971) 49-71.

Fritzsche, H., Electronic phenomena in amorphous semiconductors, Annual Review of Materials Science 2 (1972) 697-744.

Gates, B.; Wu, Y.; Yin, Y.; Yang, P.; Xia, Y., Single-crystalline nanowires of Ag2Se can be synthesized by templating against nanowires of trigonal Se, J. Am. Chem. Soc. (2001) currently ASAP.

Gosain, D.P.; Nakamura, M.; Shimizu, T.; Suzuki, M.; Okano, S., Nonvolatile memory based on reversible phase transition phenomena in telluride glasses, Jap. J. Appl. Phys. 28 (1989) 1013-1018.

Guin, J.-P.; Rouxel, T.; Keryvin, V.; Sangleboeuf, J.-C.; Serre, I.; Lucas, J., Indentation creep of Ge—Se chalcogenide glasses below Tg: elastic recovery and non-Newtonian flow, J. Non-Cryst. Solids 298 (2002) 260-269.

Guin, J.-P.; Rouxel, T.; Sangleboeuf, J.-C; Melscoet, I.; Lucas, J., Hardness, toughness, and scratchability of germanium-selenium chalcogenide glasses, J. Am. Ceram. Soc. 85 (2002) 1545-52.

Gupta, Y.P., On electrical switching and memory effects in amorphous chalcogenides, J. Non-Cryst. Sol. 3 (1970) 148-154.

Haberland, D.R.; Stiegler, H., New experiments on the charge-controlled switching effect in amorphous semiconductors, J. Non-Cryst. Solids 8-10 (1972) 408-414.

Halt, M.M.; Ibrahim, M.M.; Dongol, M.; Hammad, F.H., Effect of composition on the structure and electrical properties of As—Se—Cu glasses, J. Apply. Phys. 54 (1983) 1950-1954.

Hajto, J.; Rose, M.J.; Osborne, I.S.; Snell, A.J.; Le Comber, P.G.; Owen, A.E., Quantization effects in metal/a-Si:H/metal devices, Int. J. Electronics 73 (1992) 911-913.

Hajto, J.; Hu, J.; Snell, A.J.; Turvey, K.; Rose, M., DC and AC measurements on metal/a-Si:H/metal room temperature quantised resistance devices, J. Non-Cryst. Solids 266-269 (2000) 1058-1061.

Hajto, J.; McAuley, B.; Snell, A.J.; Owen, A.E., Theory of room temperature quantized resistance effects in metal-a-Si:H-metal thin film structures, J. Non-Cryst. Solids 198-200 (1996) 825-828.

Hajto, J.; Owen, A.E.; Snell, A.J.; Le Comber, P.G.; Rose, M.J., Analogue memory and ballistic electron effects in metal-amorphous silicon structures, Phil. Mag. B 63 (1991) 349-369.

Hayashi, T.; Ono, Y.; Fukaya, M.; Kan, H., Polarized memory switching in amorphous Se film, Japan. J. Appl. Phys. 13 (1974) 1163-1164.

Hegab, N.A.; Fadel, M.; Sedeek, K., Memory switching phenomena in thin films of chalcogenide semiconductors, Vacuum 45 (1994) 459-462.

Helbert et al., *Intralevel hybrid resist process with submicron capability*, SPIE vol. 333 Submicron Lithography, pp. 24-29 (1982).

Hilt, Dissertation: *Materials characterization of Silver Chalcogenide Programmable Metalization Cells*, Arizona State University, pp. Title page—114 (UMI Company, May 1999).

Hirose et al., *High Speed Memory Behavior and Reliability of an Amorphous $As_2S_3$ Film Doped Ag*, Phys. Stat. Sol. (a) 61, pp. 87-90 (1980).

Hirose, Y.; Hirose, H., Polarity-dependent memory switching and behavior of Ag dendrite in Ag-photodoped amorphous As2S3 films, J. Appl. Phys. 47 (1976) 2767-2772.

Holmquist et al., *Reaction and Diffusion in Silver-Arsenic Chalcogenide Glass Systems*, 62 J. Amer. Ceram. Soc., No. 3-4, pp. 183-188 (Mar.-Apr. 1979).

Hong, K.S.; Speyer, R.F., Switching behavior in II-IV-V2 amorphous semiconductor systems, J. Non-Cryst. Solids 116 (1990) 191-200.

Hosokawa, S., Atomic and electronic structures of glassy GexSe1-x around the stiffness threshold composition, J. Optoelectronics and Advanced Materials 3 (2001) 199-214.

Hu, J.; Snell, A.J.; Hajto, J.; Owen, A.E., Constant current forming in Cr/p+a−/Si:H/V thin film devices, J. Non-Cryst. Solids 227-230 (1998) 1187-1191.

Hu, J.; Hajto, J.; Snell, A.J.; Owen, A.E.; Rose, M.J., Capacitance anomaly near the metal-non-metal transition in Cr-hydrogenated amorphous Si-V thin-film devices, Phil. Mag. B. 74 (1996) 37-50.

Hu, J.; Snell, A.J.; Hajto, J.; Owen, A.E., Current-induced instability in Cr-p+a−Si:H-V thin film devices, Phil. Mag. B 80 (2000) 29-43.

Huggett et al., Development of silver sensitized germanium selenide photoresist by reactive sputter etching in SF6, 42 Appl. Phys. Lett., No. 7, pp. 592-594 (Apr. 1983).

Iizima, S.; Sugi, M.; Kikuchi, M.; Tanaka, K., Electrical and thermal properties of semiconducting glasses As—Te—Ge, Solid State Comm. 8 (1970) 153-155.

Ishikawa, R.; Kikuchi, M., Photovoltaic study on the photo-enhanced diffusion of Ag in amorphous films of Ge2S3, J. Non-Cryst. Solids 35 & 36 (1980) 1061-1066.

Iyetomi, H.; Vashishta, P.; Kalia, R.K., Incipient phase separation in Ag/Ge/Se glasses: clustering of Ag atoms, J. Non-Cryst. Solids 262 (2000) 135-142.

Jones, G.; Collins, R.A., Switching properties of thin selenium films under pulsed bias, Thin Solid Films 40 (1977) L15-L18.

Joullie, A.M.; Marucchi, J., On the DC electrical conduction of amorphous As2Se7 before switching, Phys. Stat. Sol. (a) 13 (1972) K105-K109.

Joullie, A.M.; Marucchi, J., Electrical properties of the amorphous alloy As2Se5, Mat. Res. Bull. 8 (1973) 433-442.

Kaplan, T.; Adler, D., Electrothermal switching in amorphous semiconductors, J. Non-Cryst. Solids 8-10 (1972) 538-543.

Kawaguchi et al., *Mechanism of photosurface deposition*, 164-166 J. Non-Cryst. Solids, pp. 1231-1234 (1993).

Kawaguchi, T.; Maruno, S.; Elliott, S.R., Optical, electrical, and structural properties of amorphous Ag—Ge—S and Ag—Ge—Se films and comparison of photoinduced and thermally induced phenomena of both systems, J. Appl. Phys. 79 (1996) 9096-9104.

Kawaguchi, T.; Masui, K., Analysis of change in optical transmission spectra resulting from Ag photodoping in chalcogenide film, Japn. J. Appl. Phys. 26 (1987) 15-21.

Kawamoto, Y., Nishida, M., Ionic Condition in As2S3—Ag2S, GeS2—GeS—Ag2S and P2S5—Ag2S Glasses, J. Non-Cryst Solids 20(1976) 393-404.

Kawasaki, M.; Kawamura, J.; Nakamura, Y.; Aniya, M., Ionic conductivity of Agx(GeSe3)1-x (0<=x<=0.571) glasses, Solid state Ionics 123 (1999) 259-269.

Kluge, G.; Thomas, A.; Klabes, R.; Grotzschel, R., Silver photodiffusion in amorphous GexSe100-x, J. Non-Cryst. Solids 124 (1990) 186-193.

Kolobov, A.V., on the origin of p-type conductivity in amorphous chalcogenides, J. Non-Cryst. Solids 198-200 (1996) 728-731.

Kolobov, A.V., Lateral diffusion of silver in vitreous chalcogenide films, J. Non-Cryst. Solids 137-138 (1991) 1027-1030.

Kolobov et al., Photodoping of amorphous chalcogenides by metals, Advances in Physics, 1991, vol. 40, No. 5, pp. 625-684.

Korkinova, Ts.N.; Andreichin,R.E., Chalcogenide glass polarization and the type of contacts, J. Non-Cryst. Solids 194 (1996) 256-259.

Kotkata, M.F.; Afif, M.A.; Labib, H.H.; Hegab, N.A.; Abdel-Aziz, M.M., Memory switching in amorphous GeSeTl chalcogenide semiconductor films, Thin Solid Films 240 (1994) 143-146.

Kozicki et al., Silver incorporation in thin films of selenium rich Ge—Se glasses, International Congress on Glass, vol. 2, Extended Abstracts, Jul. 2001, pp. 8-9.

Michael N. Kozicki, 1. Programmable Metallization Cell Technology Description, Feb. 18, 2000.

Michael N. Kozicki, Axon Technologies Corp. and Arizona State University, Presentation to Micron Technology, Inc., Apr. 6, 2000.

(56) References Cited

OTHER PUBLICATIONS

Kozicki et al., Applications of Programmable Resistance Changes in Metal-Doped Chalcogenides, Electrochemical Society Proceedings, vol. 99-13, 1999, pp. 298-309.

Kozicki et al., Nanoscale effects in devices based on chalcogenide solid solutions, Superlattices and Microstructures, vol. 27, No. 516, 2000, pp. 485-488.

Kozicki et al., Nanoscale phase separation in Ag—Ge—Se glasses, Microelectronic Engineering 63 (2002) pp. 155-159.

Lakshminarayan, K.N.; Srivastava, K.K.; Panwar, O.S.; Dumar, A., Amorphous semiconductor devices: memory and switching mechanism, J. Instn Electronics & Telecom. Engrs 27 (1981) 16-19.

Lal, M.; Goyal, N., Chemical bond approach to study the memory and threshold switching chalcogenide glasses, Indian Journal of pure & appl. phys. 29 (1991) 303-304.

Leimer, F.; Stotzel, H.; Kottwitz, A., Isothermal electrical polarisation of amorphous GeSe films with blocking Al contacts influenced by Poole-Frenkel conduction, Phys. Stat. Sol. (a) 29 (1975) K129-K132.

Leung, W.; Cheung, N.; Neureuther, A.R., Photoinduced diffusion of Ag in $GexSe_{1-x}$ glass, Appl. Phys. Lett. 46 (1985) 543-545.

Matsushita, T.; Yamagami, T.; Okuda, M., Polarized memory effect observed on Se—$SnO_2$ system, Jap. J. Appl. Phys. 11 (1972) 1657-1662.

Matsushita, T.; Yamagami, T.; Okuda, M., Polarized memory effect observed on amorphous selenium thin films, Jpn. J. Appl. Phys. 11 (1972) 606.

Mazurier, F.; Levy, M.; Souquet, J.L, Reversible and irreversible electrical switching in $TeO_2$—$V_2O_5$ based glasses, Journal de Physique IV 2 (1992) C2-185-C2-188.

McHardy et al., The dissolution of metals in amorphous chalcogenides and the effects o electron and ultraviolet radiation, 20 J. Phys. C.: Solid State Phys., pp. 4055-4075 (1987)f.

Messoussi, R.; Bernede, J.C.; Benhida, S.; Abachi, T.; Latef, A., Electrical characterization of M/Se structures (M=Ni,Bi), Mat. Chem. and Phys. 28 (1991) 253-258.

Mitkova, M.; Boolchand, P., Microscopic origin of the glass forming tendency in chalcogenides and constraint theory, J. Non-Cryst. Solids 240 (1998) 1-21.

Mitkova, M.; Kozicki, M.N., Silver incorporation in Ge—Se glasses used in programmable metallization cell devices, J. Non-Cryst. Solids 299-302 (2002) 1023-1027.

Mitkova, M.; Wang, Y.; Boolchand, P., Dual chemical role of Ag as an additive in chalcogenide glasses, Phys. Rev. Lett. 83 (1999) 3848-3851.

Miyatani, S.-y., Electronic and ionic conduction in $(Ag_xCu_{1-x})_2Se$, J. Phys. Soc. Japan 34 (1973) 423-432.

Miyatani, S.-y., Electrical properties of $Ag_2Se$, J. Phys. Soc. Japan 13 (1958) 317.

Miyatani, S.-y., Ionic conduction in beta-$Ag_2Te$ and beta-$Ag_2Se$, Journal Phys. Soc. Japan 14 (1959) 996-1002.

Mott, N.F., Conduction in glasses containing transition metal ions, J. Non-Cryst. Solids 1 (1968) 1-17.

Nakayama, K.; Kitagawa, T.; Ohmura, M.; Suzuki, M., Nonvolatile memory based on phase transitions in chalcogenide thin films, Jpn. J. Appl. Phys. 32 (1993) 564-569.

Nakayama, K.; Kojima, K.; Hayakawa, F.; Imai, Y.; Kitagawa, A.; Suzuki, M., Submicron nonvolatile memory cell based on reversible phase transition in chalcogenide glasses, Jpn. J. Appl. Phys. 39 (2000) 6157-6161.

Nang, T.T.; Okuda, M.; Matsushita, T.; Yokota, S.; Suzuki, A., Electrical and optical parameters of $GexSe_{1-x}$ amorphous thin films, Jap. J. App. Phys. 15 (1976) 849-853.

Narayanan, R.A.; Asokan, S.; Kumar, A., Evidence concerning the effect of topology on electrical switching in chalcogenide network glasses, Phys. Rev. B 54 (1996) 4413-4415.

Neale, R.G.; Aseltine, J.A., The application of amorphous materials to computer memories, IEEE transactions on electron dev. Ed-20 (1973) 195-209.

Ovshinsky S.R.; Fritzsche, H., Reversible structural transformations in amorphous semiconductors for memory and logic, Mettalurgical transactions 2 (1971) 641-645.

Ovshinsky, S.R., Reversible electrical switching phenomena in disordered structures, Phys. Rev. Lett. 21 (1968) 1450-1453.

Owen, A.E.; LeComber, P.G.; Sarrabayrouse, G.; Spear, W.E., New amorphous-silicon electrically programmable nonvolatile switching device, IEE Proc. 129 (1982) 51-54.

Owen, A.E.; Firth, A.P.; Ewen, P.J.S., Photo-induced structural and physico-chemical changes in amorphous chalcogenide semiconductors, Phil. Mag. B 52 (1985) 347-362.

Owen, A.E.; Le Comber, P.G.; Hajto, J.; Rose, M.J.; Snell, A.J., Switching in amorphous devices, Int. J. Electronics 73 (1992) 897-906.

Owen et al., Metal-Chalcogenide Photoresists for High Resolution Lithography and Sub-Micron Structures, Nanostructure Physics and Fabrication, pp. 447-451 (M. Reed ed. 1989).

Pearson, A.D.; Miller, C.E., Filamentary conduction in semiconducting glass diodes, App. Phys. Lett. 14 (1969) 280-282.

Pinto, R.; Ramanathan, K.V., Electric field induced memory switching in thin films of the chalcogenide system Ge—As—Se, Appl. Phys. Lett. 19 (1971) 221-223.

Popescu, C., The effect of local non-uniformities on thermal switching and high field behavior of structures with chalcogenide glasses, Solid-state electronics 18 (1975) 671-681.

Popescu, C.; Croitoru, N., The contribution of the lateral thermal instability to the switching phenomenon, J. Non-Cryst. Solids 8-10 (1972) 531-537.

Popov, A.I.; Geller, I.KH.; Shemetova, V.K., Memory and threshold switching effects in amorphous selenium, Phys. Stat. Sol. (a) 44 (1977) K71-K73.

Prakash, S.; Asokan, S.; Ghare, D.B., Easily reversible memory switching in Ge—As—Te glasses, J. Phys. D: Appl. Phys. 29 (1996) 2004-2008.

Rahman, S.; Sivarama Sastry, G., Electronic switching in Ge—Bi—Se—Te glasses, Mat. Sci. and Eng. B12 (1992) 219-222.

Ramesh, K.; Asokan, S.; Sangunni, K.S.; Gopal, E.S.R., Electrical Switching in germanium telluride glasses doped with Cu and Ag, Appl. Phys. A 69 (1999) 421-425.

Rose,M.J.;Hajto,J.;Lecomber,P.G.;Gage,S.M.;Choi,W.K.;Snell,A.J.;Owen,A.E., Amorphous silicon analogue memory devices, J. Non-Cryst. Solids 115 (1989) 168-170.

Rose,M.J.;Snell,A.J.;Lecomber,P.G.;Hajto,J.;Fitzgerald,A.G.;Owen,A.E., Aspects of non-volatility in a -Si:H memory devices, Mat. Res. Soc. Symp. Proc. V 258, 1992, 1075-1080.

Schuocker, D.; Rieder, G., On the reliability of amorphous chalcogenide switching devices, J. Non-Cryst. Solids 29 (1978) 397-407.

Sharma, A.K.; Singh, B., Electrical conductivity measurements of evaporated selenium films in vacuum, Proc. Indian Natn. Sci. Acad. 46, A, (1980) 362-368.

Sharma, P., Structural, electrical and optical properties of silver selenide films, Ind. J. of pure and applied phys. 35 (1997) 424-427.

Shimizu et al., *The Photo-Erasable Memory Switching Effect of Ag Photo-Doped Chalcogenide Glasses*, 46 B. Chem Soc. Japan, No. 12, pp. 3662-3365 (1973).

Snell, A.J.; Lecomber, P.G.; Hajto, J.; Rose, M.J.; Owen, A.E.; Osborne, I.L., Analogue memory effects in metal/a-Si:H/metal memory devices, J. Non-Cryst. Solids 137-138 (1991) 1257-1262.

Snell, A.J.; Hajto, J.;Rose, M.J.; Osborne, L.S.; Holmes, A.; Owen, A.E.; Gibson, R.A.G., Analogue memory effects in metal/a-Si:H/metal thin film structures, Mat. Res. Soc. Symp. Proc. V 297, 1993, 1017-1021.

Steventon, A.G., Microfilaments in amorphous chalcogenide memory devices, J. Phys. D: Appl. Phys. 8 (1975) L120-L122.

Steventon, A.G., The switching mechanisms in amorphous chalcogenide memory devices, J. Non-Cryst. Solids 21 (1976) 319-329.

Stocker, H.J., Bulk and thin film switching and memory effects in semiconducting chalcogenide glasses, App. Phys. Lett. 15 (1969) 55-57.

Tanaka, K., Ionic and mixed conductions in Ag photodoping process, Mod. Phys. Lett B 4 (1990) 1373-1377.

(56) References Cited

OTHER PUBLICATIONS

Tanaka, K.; Iizima, S.; Sugi, M.; Okada, Y.; Kikuchi, M., Thermal effects on switching phenomenon in chalcogenide amorphous semiconductors, Solid State Comm. 8 (1970) 387-389.

Thornburg, D.D., Memory switching in a Type I amorphous chalcogenide, J. Elect. Mat. 2 (1973) 3-15.

Thornburg, D.D., Memory switching in amorphous arsenic triselenide, J. Non-Cryst. Solids 11 (1972) 113-120.

Thornburg, D.D.; White, R.M., Electric field enhanced phase separation and memory switching in amorphous arsenic triselenide, Journal(??) (1972) 4609-4612.

Tichy, L.; Ticha, H., Remark on the glass-forming ability in $GexSe1-x$ and $AsxSe1-x$ systems, J. Non-Cryst. Solids 261 (2000) 277-281.

Titus, S.S.K.; Chatterjee, R.; Asokan, S., Electrical switching and short-range order in As—Te glasses, Phys. Rev. B 48 (1993) 14650-14652.

Tranchant,S.;Peytavin,S.;Ribes,M.;Flank,A.M.;Dexpert,H.;Lagarde,J.P., Silver chalcogenide glasses Ag—Ge—Se: Ionic conduction and exafs structural investigation, Transport-structure relations in fast ion and mixed conductors Proceedings of the 6th Riso International symposium. Sep. 9-13, 1985.

Tregouet, Y.; Bernede, J.C., Silver movements in $Ag2Te$ thin films: switching and memory effects, Thin Solid Films 57 (1979) 49-54.

Uemura, O.; Kameda, Y.; Kokai, S.; Satow, T., Thermally induced crystallization of amorphous $Ge0.4Se0.6$, J. Non-Cryst. Solids 117-118 (1990) 219-221.

Uttecht, R.; Stevenson, H.; Sie, C.H.; Griener, J.D.; Raghavan, K.S., Electric field induced filament formation in As—Te—Ge glass, J. Non-Cryst. Solids 2 (1970) 358-370.

Viger, C.; Lefrancois, G.; Fleury, G., Anomalous behaviour of amorphous selenium films, J. Non-Cryst. Solids 33 (1976) 267-272.

Vodenicharov, C.; Parvanov,S.; Petkov,P., Electrode-limited currents in the thin-film M-GeSe-M system, Mat. Chem. and Phys. 21 (1989) 447-454.

Wang, S.-J.; Misium, G.R.; Camp, J.C.; Chen, K.-L.; Tigelaar, H.L., High-performance Metal/silicide antifuse, IEEE electron dev. Lett. 13 (1992)471-472.

Weirauch, D.F., Threshold switching and thermal filaments in amorphous semiconductors, App. Phys. Lett. 16 (1970) 72-73.

West, W.C.; Sieradzki, K.; Kardynal, B.; Kozicki, M.N., Equivalent circuit modeling of the Ag|As0.24S0.36Ag0.40|Ag System prepared by photodissolution of Ag, J. Electrochem. Soc. 145 (1998) 2971-2974.

West, W.C., Electrically erasable non-volatile memory via electrochemical deposition of multifractal aggregates, Ph.D. Dissertation, ASU 1998.

Zhang, M.; Mancini, S.; Bresser, W.; Boolchand, P., Variation of glass transition temperature, Tg, with average coordination number, $<m>$, in network glasses: evidence of a threshold behavior in the slope.$|dTg/d<m>|$ at the rigidity percolation threshold ($<m>=2.4$), J. Non-Cryst. Solids 151 (1992) 149-154.

Database Inspec. 'Online! The Institution of Electrical Engineers, Stevenage, GB; Sep. 1999; Chuprakov, I.S. et al, "CVC of metal chalcogenide films." XP002337486.

Safran, G. et al.—"Development and Properties of Single-Crystal Silver Selenide Layers," Thin Solid Films, Elsevier-Sequoia S.A. Lausanne, Ch, vol. 215, No. 2, Aug. 14, 1992, pp. 147-151.

Damodara, Das V. et al.—"Variations of energy gap, resistivity, and temperature coefficient of resistivity in annealed 'beta!-Ag2Se thin films," Physical Review B (Condensed Matter) USA, vol. 39, No. 15, May 15 1989, pp. 10872-10878.

Saito, K. et al.—"X-ray lithography with a Ag—Se/Ge—Se inorganic resist using synchrotron radiation," Journal of Applied Physics USA, vol. 63, No. 2, Jan. 15, 1988, pp. 565-567.

International Search Report, dated Aug. 8, 2005.

Y. Kawamoto et al.—"Ionic Condition in As2S3—AgS, GeS2—GeS2—Ag2S and P2S5—Ag2S Glasses," J. Non-Cryst Solids, 20 (1976), 393-404.

M. Kozicki, "1. Programmable Metallization Cell Technology Description," Feb. 18, 2000.

M. Kozicki, Axon Technologies Corp. and Arizona State University, Presentation to Micron Technology, Inc. Apr. 6, 2000.

Bernede et al.,"Polarized memory switching effects in Ag2Se/Se/M thin film sandwiches", 1982, Thin Solid Fims, vol. 97, Issue 2, Abstract.

Kumar et al., "Structural, electrical and optical properties of silver selenide thin films", Feb. 14, 2002, Semicond. Sci Technol. 17 (2002) 261-265.

Tait, et al., "Nodular Defect Growth and Structure in Vapor Deposited Films", (1995) Journal of Electronic Materials, vol. 24 No. 8, 935-940.

* cited by examiner

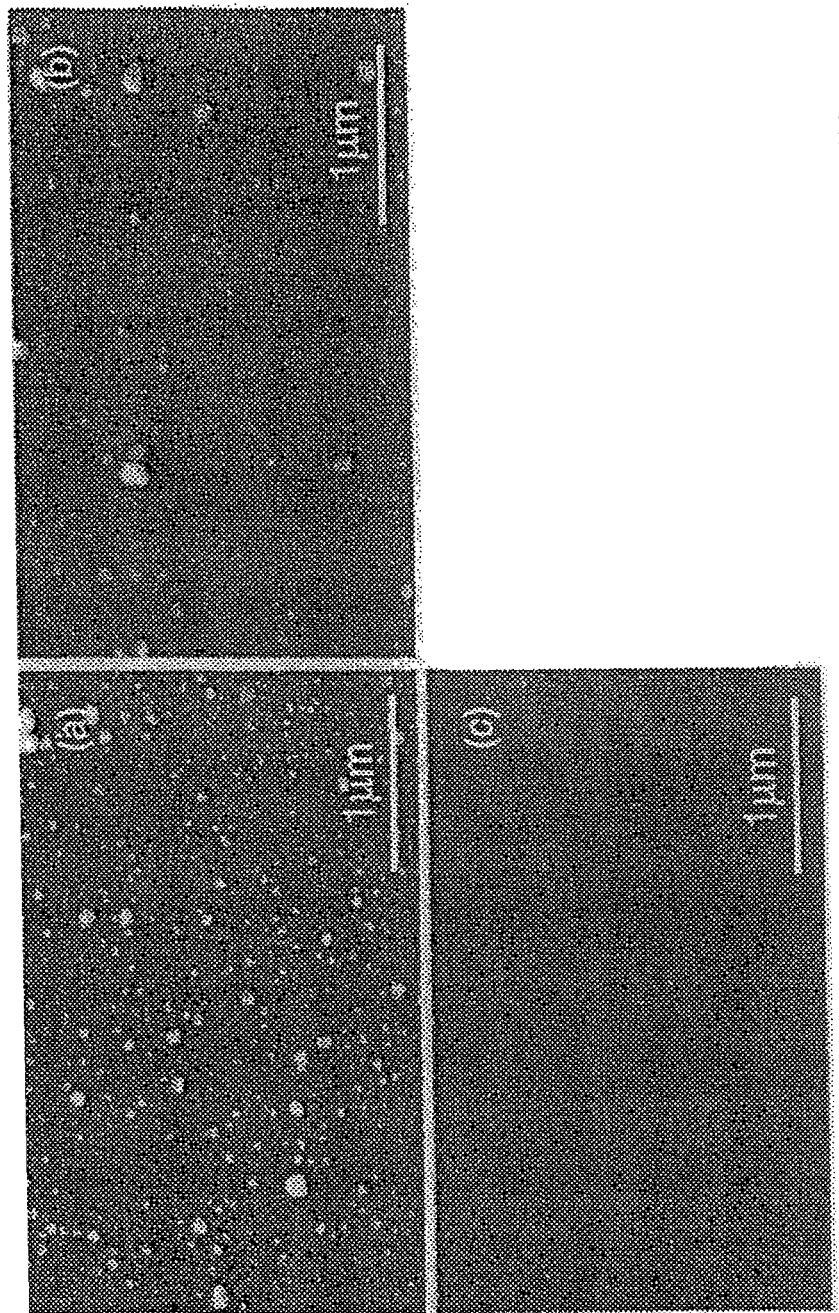
Pulse DC Ag₂Se sputter deposition at different pressure. (a) 20mTorr deposition, (b) 10mTorr deposition, (c) 3mTorr deposition.

US 9,552,986 B2

FORMING A MEMORY DEVICE USING SPUTTERING TO DEPOSIT SILVER-SELENIDE FILM

CROSS-REFERENCE TO RELATED APPLICATIONS

This application is a continuation of U.S. patent application Ser. No. 12/073,057, filed on Feb. 28, 2008, which is a continuation of U.S. patent application Ser. No. 10/230,279, filed on Aug. 29, 2002, now U.S. Pat. No. 7,364,664, issued Apr. 29, 2008, the disclosures of which are incorporated in their entirety by reference herein.

FIELD OF THE INVENTION

The invention relates to the field of resistance variable memory devices formed using a chalcogenide glass and, in particular, to an improved method of depositing a silver-selenide film on a chalcogenide glass.

BACKGROUND OF THE INVENTION

Chalcogenide materials are presently of great interest for use in resistance variable memory devices compared to memory technologies currently in use, due to potential advantages in switching characteristics, non-volatility, memory speed, reliability, thermal characteristics, and durability. Research in this area is reported in the articles "High Speed Memory Behavior and Reliability of an Amorphous $As_2S_3$ Film doped with Ag" by Hirose et al., Phys. Stat. Sol. (1980), pgs. K187-K190; "Polarity-dependent memory switching and behavior of Ag dendrite in Ag-photodoped amorphous $As_2S_3$ films" by Hirose et al., Journal of applied Physics, Vol. 47, No. 6 (1976), pgs. 2767-2772; and "Dual Chemical Role of Ag as an Additive in Chalcogenide Glasses" by Mitkova et al., Physical Review Letters, Vol. 83, No. 19 (1999), pgs. 3848-3851, the disclosures of which are incorporated herein by reference.

In many memory cell designs employing chalcogenide materials, a film of silver-selenide ($Ag_2Se$) is incorporated with a chalcogenide material layer. The silver-selenide film is important for electrical performance. Accordingly, silver-selenide deposition is an important aspect of fabricating the resistance variable memory device. Most available research in silver-selenide deposition is limited and evaporation deposition is normally chosen for silver-selenide film formation.

Silver-selenide deposition by evaporation has an attendant problem because the dissociative properties of silver-selenide make it impossible to achieve precision stoichiometries of silver-selenide. It is believed that in evaporation techniques, as the silver starts to diffuse to a lower concentration, it begins to agglomerate. As the silver is tied up in clusters or agglomerates, selenium is more readily available for evaporation in the beginning of the evaporation process. Thus, during evaporation techniques, selenium is evaporated more quickly, causing the deposition target to become silver-rich. Near the end of the evaporation process little to no selenium is left for deposition onto the substrate, leaving mostly silver available for deposition. Thus substantial amounts of selenium are deposited on the substrate followed by deposition of primarily silver. Accordingly, the evaporation technique therefore does not uniformly deposit the silver-selenide and controlling the stoichiometry and surface morphology of evaporated silver-selenide is difficult.

Furthermore, evaporation deposition is not conducive to industrial application. Sputter deposition is more readily available for industrial processes and sputter deposition has many advantages compared to evaporation deposition techniques. For example, sputter deposition provides better film thickness and quality control.

Generally, sputter deposition, or sputtering, is performed by placing a substrate in a deposition chamber which is evacuated or pressurized to a desired pressure. A particle stream of the film material usually generated from a target is then generated within the chamber and the deposition occurs by condensation of the particles onto the substrate. In another sputtering technique, often referred to as ion beam bombardment sputtering, a high-energy source beam of ions is directed toward the target. The force of the bombarding ions imparts sufficient energy to the atoms of the target to cause the energized atoms to leave the target and form a particle stream. The resulting deposition upon the substrate forms a thin film.

Due to the high diffusion property of silver, low melting point of selenium, and the memory properties of silver-selenide, controlling the stoichiometry and morphology of the silver-selenide film during sputter deposition is difficult. For instance, silver-selenide bulk material is conductive, but its conductivity (about thousands $ohm^{-1}cm^{-1}$) is relatively lower than that of most metals. Also, silver concentration is critical for electrical performance of the device, thus it is necessary to maintain the silver concentration close to about 66.7 atomic weight percent (herein after represented "%"). With silver concentrations higher than about 67.5%, many nodular defects are formed in and/or on the silver-selenide film. The size of these defects can be about a tenth of a micrometer, which could have severe negative impact on sub micron device fabrication. Although the exact mechanism by which these defects are formed are unknown, it is believed that these defects are caused by excess silver, beyond the desired stoichiometric silver concentration requirements of the silver-selenide film.

It would be desirable to have an improved method of depositing a silver-selenide film. It would also be desirable to have a method of controlling the stoichiometry and morphology of silver-selenide for sputter deposition.

BRIEF SUMMARY OF THE INVENTION

An exemplary embodiment of the present invention includes a method of depositing a silver-selenide film on a substrate. The method includes using a low pressure sputter deposition process. Preferred sputter deposition processes include RF sputtering or pulse DC sputtering. Preferably, the sputter deposition will occur in pressures ranging from about 0.3 mTorr to about 10 mTorr. The invention is particularly useful for depositing a silver-selenide film with better stoichiometric precision. The invention is also particularly useful for sputter depositing a silver-selenide film while avoiding nodular defect formation throughout and on the surface of the silver-selenide film.

These and other features and advantages of the invention will be better understood from the following detailed description, which is provided in connection with the accompanying drawings.

BRIEF DESCRIPTION OF THE DRAWINGS

FIG. 1(a) is an SEM image of a pulse DC sputter deposited silver-selenide film deposited using a pressure of 20 mTorr.

FIG. 1(b) is an SEM image of a pulse DC sputter deposited silver-selenide film deposited using a pressure of 10 mTorr.

FIG. 1(c) is an SEM image of a pulse DC sputter deposited silver-selenide film deposited using a pressure of 3 mTorr.

DETAILED DESCRIPTION OF THE INVENTION

In the following detailed description, reference is made to various specific structural and process embodiments of the invention. These embodiments are described with sufficient detail to enable those skilled in the art to practice the invention. It is to be understood that other embodiments may be employed, and that various structural, logical and electrical changes may be made without departing from the spirit or scope of the invention.

The term "silver-selenide" is intended to include various species of silver-selenide, including some species which have a slight excess or deficit of silver, for instance, $Ag_2Se$, $Ag_{2+x}Se$, and $Ag_{2-x}Se$.

The term "chalcogenide glass" is intended to include various composition structures based on elements from Group VIA (S, Se, Te, Po, O) alone or in combination with elements from group IV (Si, Ge) and/or group V (P, As, Sb, Bi).

The present invention relates to a process for depositing silver-selenide. In accordance with the invention, low pressures, of for example, 0.3 mTorr to about 10 mTorr, are used to sputter deposit silver-selenide. Also in accordance with the invention, silver-selenide is preferably deposited using an RF sputtering process or pulse DC sputtering process.

Silver-selenide itself has electrical memory properties, i.e. conductivity, and sputter deposition processes normally involve strong current, voltage and ion bombardment. Therefore, both electrical and thermal effects from the sputter deposition process can influence the silver-selenide sputter target and deposited silver-selenide film. For the above reason, sputter deposition requires consideration on how to apply electrical power to silver-selenide targets.

Since the conductivity of silver-selenide is relatively lower than that of most metals, D.C. sputtering has not worked. Regular DC magnetron sputtering attempts have not been effective, primarily because the plasma is not easily ignited.

Depending on the target age, sputter deposition at higher pressures, e.g., about 20 mTorr or greater, result in films with either lower or higher silver concentrations than the desired stoichiometric silver concentration of about 66.7%. It has been observed that high pressure deposition, e.g., about 20 mTorr or greater, of relatively new targets using RF or pulse DC magnetron sputter deposition result in silver-selenide films having silver concentrations of only about 60%, which is much lower than the desired stoichiometric silver concentration of 66.7%. It has also been observed that high pressure deposition, e.g., about 20 mTorr or greater, of relatively old targets using RF or pulse DC magnetron sputter deposition result in silver-selenide films having silver concentrations higher than about 67.5%.

The inventors have discovered that RF or pulse DC magnetron sputter deposition processes at low pressures ranging from about 0.3 mTorr to about 10 mTorr may be used to deposit more precise stoichiometric silver-selenide films while avoiding nodular defects formation in the film. It has also been discovered that the silver-selenide target composition changes over the lifetime of the target, and that the use of a low pressure sputter deposition process allows for precise stoichiometric deposits from both old and new silver-selenide targets.

FIG. 1 shows SEM images of substrates formed of production grade silicon wafers with silicon nitride films having a pulse DC sputter deposited silver-selenide film of about 500 Angstroms thick. The silver-selenide films shown in FIG. 1 were pulse DC sputter deposited using a Denton Vacuum Discovery® 24 at 200 kHz with a 1056 ns pulse width, and a constant power supply of 150 W. A silver-selenide target having a stoichiometric silver concentration of about 66.7% was used to deposit the silver-selenide film. Comparing the SEM images of the pulse DC sputter deposited silver-selenide films at various pressures indicate that low pressure sputter deposition ranging from about 0.3 mTorr to about 10 mTorr reduces and eliminates nodular defect formations. It was observed that a silver-selenide film deposited using high pressure, i.e., about 20 mTorr, has a silver concentration higher than about 67.5% and has nodular defect formations on the surface and through out the film as shown in FIG. 1(a); as shown in FIG. 1(b) a deposited silver-selenide film formed using a low pressure of 10 mTorr has relatively few nodular defect formations; and as shown in FIG. 1(c) a deposited film using an even lower pressure of 3 mTorr has a smooth surface with no nodular defects.

In accordance with a first embodiment of the invention, a silver-selenide target is sputter deposited using an RF sputter deposition process at a low pressure ranging from about 0.3 mTorr to about 10 mTorr, and more preferably about 2 mTorr to about 3 mTorr, to provide a silver-selenide film having little to no nodular defects and a silver concentration of about equivalent to the silver concentration of a silver-selenide target used to sputter deposit the silver-selenide film. For example, where a silver-selenide target having a silver concentration of about 66.7% is used in the RF sputter deposition process, the deposited silver-selenide film will have a silver concentration of less than about 67.5% and preferably about 67% and more preferably about 66.7%. A process in accordance with the first embodiment of the invention may be used for silver-selenide targets of any age, while still providing a sputter deposited silver-selenide film having a silver concentration about equivalent to that of the silver-selenide target used to deposit the silver-selenide film.

In a sputtering process in accordance with the first embodiment of the invention, the sputtering deposition generally takes place in a chamber. An initial base vacuum pressure is established first. The initial base vacuum pressure may be any suitable pressure, including pressures higher than about 10 mTorr, which may help ignite the plasma. During the sputtering process, process gas should be maintained at a pressure ranging from about 0.3 mTorr to about 10 mTorr, and preferably ranging from about 2 mTorr to about 3 mTorr. The process gas may be any suitable sputtering process gas, for example, krypton, xenon, helium, neon, argon or combinations thereof. The preferred process gas is argon. Although not wishing to be limited by to any particular amounts of power, power applied during the sputtering process preferably may range, for example, between about 100 watts to about 500 watts and is most preferably about 150 watts. Power density and power requirements may vary and depend on the chosen system or size of the target. For example, targets four inches or larger may require more power. The preferred RF frequency is between about 100 kHz and about 20 MHz and is preferably 13.5 MHz. An exemplary sputter deposition system is the Denton Vacuum Discovery® 24.

In accordance with a second embodiment of the invention, a silver-selenide target is sputter deposited using a pulse DC sputter deposition process at low pressures ranging from about 0.3 mTorr to about 10 mTorr to provide a silver-selenide film having a silver concentration of about equivalent to the silver concentration of a silver-selenide target used to sputter deposit the silver-selenide film. For example, where a silver-selenide target having a silver concentration of about 66.7% is used in the pulse DC sputter deposition process the deposited silver-selenide film will have a silver concentration of less than about 67.5% and preferably about 67% and more preferably about 66.7%. A low pressure of from about 4 to about 5 mTorr is preferred. There is a difference between RF sputter deposition and pulse DC sputter deposition in that for pulse DC sputtering a deposition pressure of from about 4 to about 5 mTorr, produces a deposited silver-selenide film having a silver concentration of substantially equivalent to the silver concentration of the silver-selenide target, for example 66.7%. However, generally low pressure deposition provides smoother sputter deposited silver-selenide films having a more precise silver-selenide stoichiometry. The preferred low pressure used may vary depending on the condition of the target, for example, age of the target.

Similar to the process described above in accordance, with the first embodiment of the invention, the sputtering deposition in accordance with the second embodiment also takes place in a chamber, for example, in a Denton Vacuum Discovery® 24, where a suitable initial base vacuum pressure is established first and a suitable process gas is employed. However, in accordance with the second embodiment, during the sputtering process, the process gas should be maintained at a pressure ranging from about 0.3 mTorr to about 10 mTorr, and preferably ranging from about 4 mTorr to about 5 mTorr. Although not wishing to be limited by to any particular amounts of power, the power applied during the sputtering process preferably may range, for example, between about 100 watts to about 500 watts and is most preferably 150 watts and the preferred pulse DC frequency may range, for example, between about 100 kHz and about 250 kHz and is preferably about 200 kHz. However, power density and power requirements may vary and t will depend on the chosen system and/or size of the target. For example, targets four inches or larger may require more power. The pulse width should range from about 1000 ns to about 1200 ns and is preferably about 1056 ns.

Although the exact mechanism to explain the origin of experimental observations is unknown there is a connection between sputter pressure, ion kinetic energy, scattering induced energy reduction, and/or RF and pulse DC plasma electrical properties. For practical application, the inventors propose to use an RF sputter deposition process or pulse DC sputter deposition process at lower pressure to deposit better precision stoichiometric silver-selenide films and avoid nodular defect formations on the film. Accordingly, pressure may be varied within the low pressure range of from about 0.3 mTorr to about 10 mTorr to fine tune the silver concentration of the silver-selenide film. The power sources may be varied as well. This is of great importance in device fabrication in that many devices require elemental concentrations slightly deviated (i.e., ±2% at. concentration) from the preferred value of about 66.7%. Accordingly, since low pressure sputter deposition can also be used on relatively old targets while still providing more precise stoichiometric concentrations of silver, the invention expands the target lifetime thus reducing process costs.

While exemplary embodiments of the invention have been described and illustrated, various changes and modifications may be made without departing from the spirit or scope of the invention. Accordingly, the invention is not limited by the foregoing description, but is only limited by the scope of the appended claims.

What is claimed as new and desired to be protected by Letters Patent is:

1. A method of forming a memory device comprising:
   setting an initial base pressure of a process gas in a vacuum chamber;
   maintaining a pressure of the process gas at a value including or between 0.3 mTorr and 10 mTorr;
   applying a power level based at least in part on the maintained pressure to a single sputter target comprising a first concentration of silver equal to 66.7 atomic weight percent and a second concentration of selenide; and
   forming a film over a substrate based at least in part on the application of the power level and the maintenance of the pressure,
   wherein the film comprises a third concentration of silver between 66.7 atomic weight percent and 67.5 atomic weight percent and a fourth concentration of selenide.

2. The method of claim 1, wherein the third concentration of silver of the film is equal to 66.7 atomic weight percent.

3. The method of claim 1, wherein setting the initial base pressure comprises:
   setting the initial base pressure to a value including or between 2 mTorr and 3 mTorr.

4. A method of forming a memory device, comprising:
   sputtering a single sputter target to form a film over a substrate,
   wherein the sputtering is performed at between 0.3 mTorr to 10 mTorr,
   wherein the sputter target comprises a first concentration of silver equal to 66.7 atomic weight percent and a second concentration of selenide, and
   wherein the film comprises a third concentration of silver between 66.7 atomic weight percent and 67.5 atomic weight percent and a fourth concentration of selenide.

5. A method of forming a silver-selenide film comprising:
   setting an initial base pressure of a process gas in a vacuum chamber;
   maintaining a pressure of the process gas at a value including or between 0.3 mTorr and 10 mTorr;
   applying a power level to a single sputter target having a formula of $Ag_ySe$, wherein the power level is based at least in part on the initial base pressure of the process gas; and
   forming a film having a formula of $Ag_xSe$ over a substrate based at least in part on the application of the power level and the maintenance of the pressure, wherein the film has a concentration of silver equal to 66.7 atomic weight percent, and
   wherein a value of x is different from a value of y.

6. The method of claim 5, wherein the film is formed by RF sputtering.

7. The method of claim 5, wherein the film is formed by pulse DC sputtering.

8. The method of claim 5, wherein setting the initial base pressure comprises:
   setting the initial base pressure to 3 mTorr.

9. A method of forming a film, comprising:
   setting an initial base pressure between 0.3 mTorr to 10 mTorr;

sputtering a single sputter target having a formula of $Ag_y Se$ to form a film having a formula of $Ag_x Se$ over a substrate,
wherein a value of x is different from a value of y, and
wherein the film has a concentration of silver between 66.7 atomic weight percentage and 67.5 atomic weight percentage.

\* \* \* \* \*